United States Patent [19]

Bergmann et al.

[11] Patent Number: 4,821,297

[45] Date of Patent: Apr. 11, 1989

[54] DIGITAL PHASE LOCKED LOOP CLOCK RECOVERY SCHEME

[75] Inventors: Ernest E. Bergmann, Fountain Hill Borough; Sherre M. Staves, Telford Borough, both of Pa.

[73] Assignee: American Telephone and Telegraph Company, AT&T Bell Laboratories, Murray Hill, N.J.

[21] Appl. No.: 123,040

[22] Filed: Nov. 19, 1987

[51] Int. Cl.[4] .............................................. H03D 3/24
[52] U.S. Cl. ..................................... 375/120; 375/83; 375/106
[58] Field of Search ............... 375/119, 120, 118, 106, 375/55, 87, 52, 83

[56] References Cited

U.S. PATENT DOCUMENTS

| | | | |
|---|---|---|---|
| 3,983,498 | 9/1976 | Malek | 328/155 |
| 4,218,771 | 8/1980 | Hogge, Jr. | 375/120 |
| 4,280,099 | 7/1981 | Rattlingourd | 328/63 |
| 4,357,707 | 11/1982 | Delury | 375/119 |
| 4,363,002 | 12/1982 | Fuller | 375/87 X |
| 4,584,695 | 4/1986 | Hee Wong et al. | 375/81 |

OTHER PUBLICATIONS

Design of PLL-Based Clock Generation Circuits, Deog-Kyoon Jeong et al., IEEE Journal of Solid-State Circuits, vol. SC-22, Apr. 1987, No. 2.

Primary Examiner—A. D. Pellinen
Assistant Examiner—Derek S. Jennings
Attorney, Agent, or Firm—W. W. Koba

[57] ABSTRACT

A digital clock recovery scheme is disclosed. A reference clock, is used to provide a plurality of N signals with different clock phases. The incoming data stream is sampled and clocked with the reference clock to generate a plurality of M samples for each data bit. The logic values of the M samples are then analyzed to determine the relationship between the current clock phase and the data bit transition. In particular, if all samples agree, the clock phase is correctly aligned with the data. If the clock phase is either leading or lagging the data, various samples will disagree. In the latter situation, the clock phase is adjusted until all samples agree, the particular clock which provides this state thus being defined as the recovered clock signal.

18 Claims, 5 Drawing Sheets

DIGITAL PHASE LOCKED LOOP CLOCK RECOVERY SCHEME

BACKGROUND OF THE INVENTION

1. Technical Field

The present invention relates to a digital phase locked loop (DPLL) clock recovery scheme and, more particularly, to a DPLL clock recovery scheme useful with fast acquisition/burst mode applications.

2. Description of the Prior Art

For various types of digital communication systems, it is necessary for the receiver of the information to become synchronized with the transmitted data in order to insure the validity of the received data. In most cases, the receiver includes circuits, known as clock recovery circuits, to perform this task. Many different clock recovery schemes have been developed in the past for long haul and data link applications. Most of these clock recovery schemes utilize an analog PLL arrangement, which typically comprises a phase detector (to compare the phase of the received digital data signal with that of a clock signal), a low pass filter to convert an error signal from the phase detector to an error voltage, and a voltage-controlled oscillator (VCO) having an output frequency that is controlled by the generated error voltage. Most analog PLL circuits, however, are relatively complex and contain various capacitors and resistor components which cannot be easily integrated to form a monolithic structure.

Digital phase-locked loop recovery schemes have also been utilized in the past. One such arrangement being disclosed in U.S. Pat. No. 3,983,498 issued to C. J. Malek on Sept. 28, 1976. Malek utilizes an oscillator, programmable frequency divider, phase detector, and data transition detector. The transition detector is used to generate a pulse of defined width at each data transition. The oscillator is used to generate a fixed frequency signal which is subsequently divided down to the desired clock frequency by the programmable frequency divider. To synchronize the phase of the clock signal with the data transitions, the phase of the data is compared with the phase of the oscillator in the phase detector. Depending upon whether the clock phase leads or lags the data phase, the divisor of the programmable divider is adjusted so as to advance or retard the clock phase to achieve synchronization. A problem with the Malek DPLL scheme, however, is that the adjustments to the clock phase are made at every data transition, tending to cause excessive phase jitter in the clock output cycle. An alternative DPLL arrangement which addresses this problem is disclosed in U.S. Pat. No. 4,280,099 issued to G. D. Rattlingourd on July 21, 1981. In the Rattlingourd arrangement, the clock reference signal is phase matched with the digital data by comparing the positive going and negative edges of the data with the clocking edge of the clock signal. A hard decision is made on the relative phase of the clock signal and the data only after several edge transitions have occurred. By waiting through a number of edge transitions, the amount of jitter in the recovered clock signal will be greatly reduced. However, there are many applications which require the fast acquisition of the recovered clock, broadcast Local Area Networks (LANs) and various burst mode communication systems, being only two examples. The relatively long acquisition time of the Rattlingourd arrangement would be unacceptable for these applications.

An alternative high speed DPLL clock recovery scheme is disclosed in U.S. Pat. No. 4,584,695 issued to H. Wong et al. on Apr. 22, 1986. The Wong et al. arrangement utilizes a multi-phase driver clock to generate a series of output clock signals which are phase-offset from one another. One of the output clock signals is used to sample the incoming Manchester encoded data at locations before, nominally at, and after a predicted clock edge. The sampled bit pattern then indicates whether a leading or lagging phase clock signal should be substituted for the present clock signal. Although the Wong et al. arrangement may be considered an advance over other prior art techniques, it is limited to situations employing Manchester encoded data. That is, the Wong et al. recovery scheme requires the sampling of a received data pattern containing a mid-bit transition, and produces as the output a decoded representation of the Manchester data.

Therefore, a need remains in the prior art for a clock recovery scheme which can provide fast acquisition of the clock, regardless of the type of encoding of the incoming data stream.

SUMMARY OF THE INVENTION

The need remaining in the prior art is addressed by the present invention which relates to a DPLL clock recovery scheme and, more particularly, to a DPLL clock recovery scheme useful with fast acquisition/burst mode applications.

The present scheme utilizes a fixed local clock (crystal oscillator) to generate a plurality of phase delayed clock pulses. The incoming data is sampled at different locations during the local clock interval, where these samples are then analyzed to determine if the clock phase is accurate, or needs to be adjusted. If all the samples agree in value, no phase adjustment is required. Otherwise, the phase will be incremented or decremented until all samples agree. A sample in the middle of the interval is defined as the retimed data output signal, since the midpoint sample value will most likely represent valid data, regardless of the degree of misalignment between the data and the clock.

In accordance with the present invention, a programmable logic array (PLA) may be utilized to perform the phase adjustment, using as input information the current clock phase value and the data sample values. The PLA, by virtue of its design, is also able to "remember" its previous phase adjustment command, where this attribute may be utilized to prevent the arrangement from oscillating between two clock phases as a result of sending alternating commands of increment and decrement. Additional features may be incorporated with this scheme, including the ability to "lock" or hold the phase at any predetermined value, as well as the ability to force the phase through a particular adjustment sequence.

Various other attributes of the present clock recovery scheme will become apparent during the course of the following discussion and by reference to the accompanying drawings.

BRIEF DESCRIPTION OF THE DRAWING

Referring now to the drawings.

DETAILED DESCRIPTION

Figure 1:
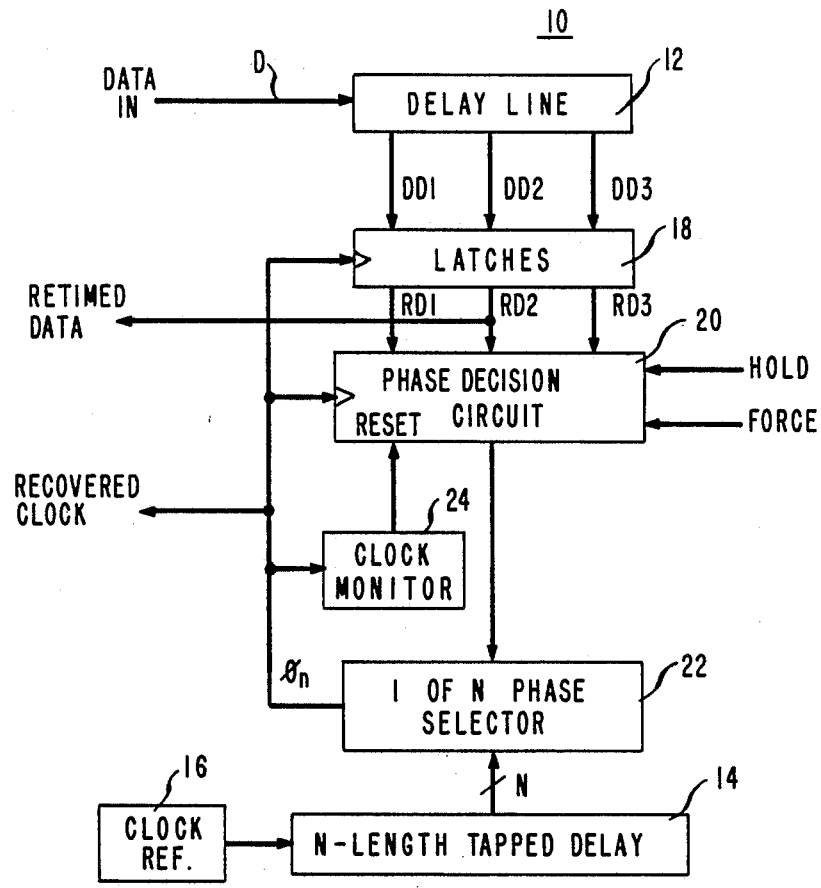
FIG. 1 illustrates, in block diagram form, an exemplary arrangement for performing clock recovery in accordance with the present invention.

FIG. 1 illustrates an exemplary DPLL clock recovery arrangement 10 formed in accordance with the present invention. As shown, clock recovery arrangement 10 comprises first and second tapped delay lines 12 and 14, respectively, a reference clock 16, a set of latches 18, a phase decision circuit 20 and a phase selector 22.

The received data stream D is applied as an input to first delay line 12, where delay line 12 functions to generate as an output three separate waveforms, denoted DD1, DD2 and DD3, each a distinct, delayed representation of the input D. A plurality of N reference clocks, each of the same frequency but separated in phase by the value $\Delta\phi$ are produced by second tapped delay line 14. As seen by reference to FIG. 1, reference clock 16, which may be a crystal oscillator, is applied as the input to N-length second delay line 14 to generate the N clock signals. The number of taps, N, determines the obtainable resolution between adjacent phase values. For example, with N=10 and a 20 MHz reference clock, each clock output will be shifted in phase by 5ns. The plurality of N clock signals are applied as separate inputs to clock selector 22 which functions to produce as an output the clock signal with the desired phase.

This output, as shown in FIG. 1, is utilized as the clock input to latches 18, where the remaining inputs to latches 18 are the three waveforms DD1, DD2, and DD3. The outputs from latches 18, clocked logic values of these waveforms, are thus defined as retimed data samples RD1, RD2, and RD3.

Figure 2:
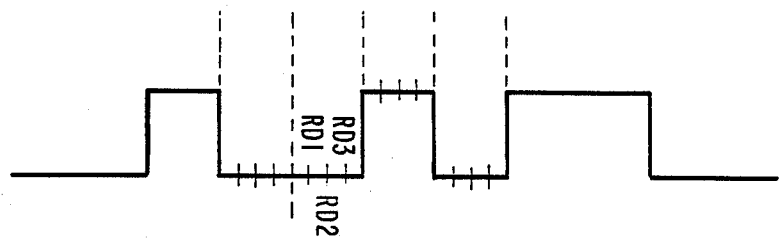
FIG. 2 is a timing diagram illustrating an incoming data stream which is aligned in phase with the local clock.
Figure 3:
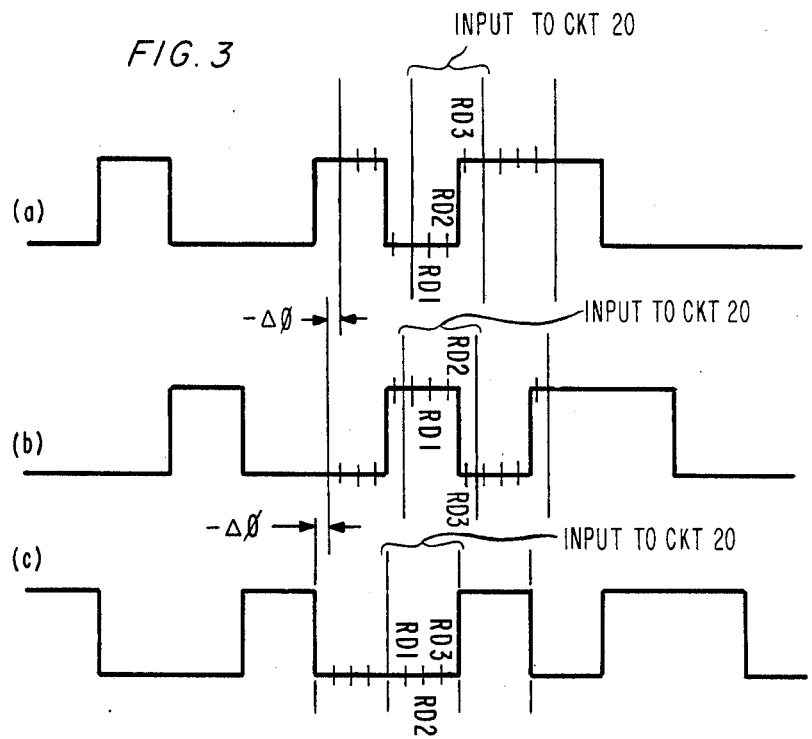
FIG. 3 illustrates, in the form of a set of timing diagrams, the steps involved in decrementing the phase of the local clock to synchronize with the incoming data.
Figure 4:
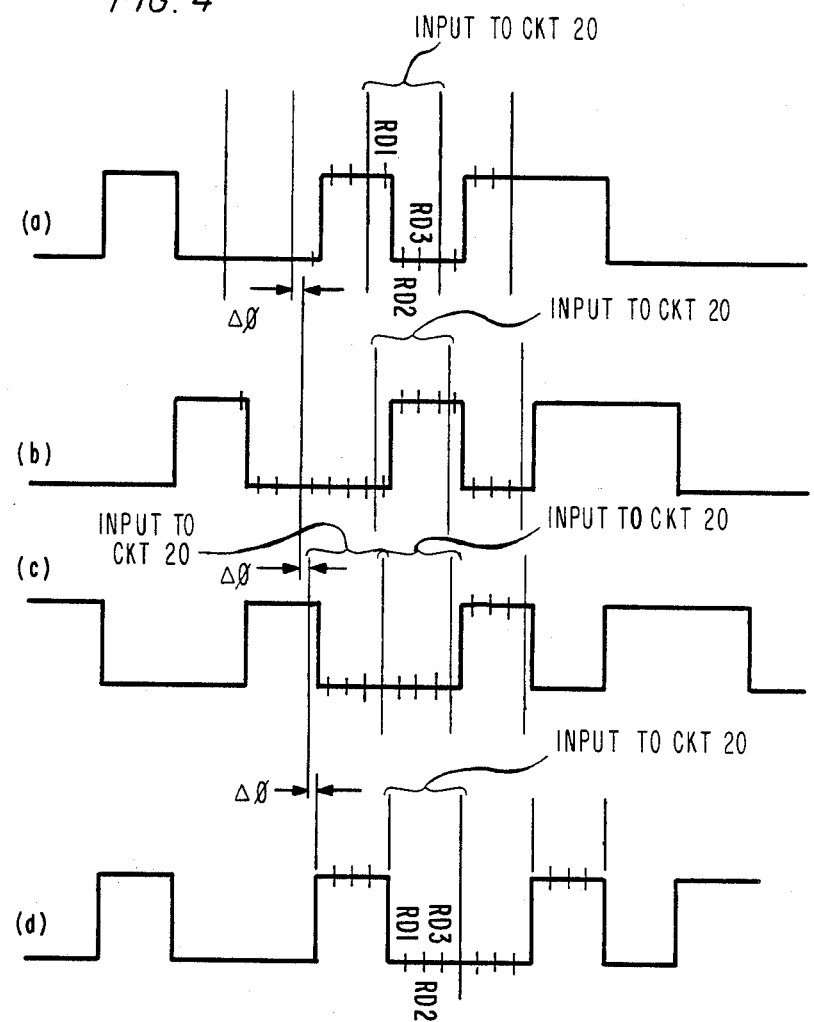
FIG. 4 illustrates, in the form of a set of timing diagrams, the steps involved in incrementing the phase of the local clock to synchronize with the incoming data.

With the availability of the N different clock phases, the problem of clock recovery thus reduces to merely selecting the proper phase of the presented N phases. This selection is accomplished by a phase decision circuit 20, which receives as inputs the retimed data samples RD1, RD2, and RD3, as well as the current phase of the clock, $\phi_n$. In accordance with the teachings of the present invention, phase decision circuit 20 compares the values of RD1, RD2, and RD3 to determine whether the current clock phase is correct or requires modification (incrementing or decrementing). FIGS. 2-4 are helpful in explaining the operation of circuit 20.

Referring to FIG. 2, a timing diagram is shown of incoming data. The clock signal is represented by the vertical lines. The locations of RD1, RD2, and RD3 for each data bit are indicated by their respective numerals in FIG. 2. For this particular example, RD1 may represent the 10% interval of the data bit, RD2 the 50% interval, and RD3 the 90% interval. Other interval values for RD1 and RD3 may be used, for example, 25% and 75%, respectively. In accordance with the teachings of the present invention, however, the middle sample value must be chosen at or near the 50% interval since this position of the data bit will most likely represent the correct data bit value, regardless of the initial misalignment of the clock. Therefore, RD2 is utilized as the retimed data output of recovery arrangement 10. For the particular situation illustrated in FIG. 2, data samples RD1, RD2 and RD3 will always be identical in value, since the phase of the clock is correctly synchronized with the data stream. That is, the RD1-RD2-RD3 inputs to decision circuit 18 will either be "1-1-1" or "0-0-0." Provided with this input, decision circuit 20 will transmit a "no change" output signal to phase selector 22.

In most cases, the initially received data stream will not be in phase with the clock and some adjustment will be required. FIG. 3 illustrates a typical example when the clock phase is leading the data stream. In FIG. 3(a), both samples RD1 and RD2 comprise the same logic "0" value. However, a data bit transition has occurred before the third sample is taken, so sample RD3 will have a logic "1" value. The input "0-0-1" thus presented to decision circuit 20 will result in the generation of a "decrement" output which is subsequently applied as an input to selector 22. Selector 22 then performs a $-\Delta\phi$ adjustment, providing a clock with this modified phase to latches 18 and circuit 20. The result of this adjustment for the next data bit is shown in FIG. 3(b), where the phase has been adjusted by $\Delta\phi$. Although the misalignment is less, the data is still not synchronous with the clock, the new inputs to decision circuit 18 being "1-1-0." This input to circuit 20 directs the generation of another "decrement" output to selector 22, resulting in another $-\Delta\phi$ shift in the clock phase. The result of this second adjustment is shown in FIG. 3(c). This last adjustment, as can be seen, has caused the clock to be correctly aligned with the data, where RD1, RD2, and RD3 are now all the same logic "0" value. Presented with this "0-0-0" input, circuit 20 will now instruct selector 22 to maintain, or hold, the present clock phase, as long as the sampled data points continue to agree in value.

FIG. 4 illustrates the alternative situation, where the clock phase lags the data transitions. Referring to FIG. 4(a), RD1 is seen to comprise a logic "1" value, while both RD2 and RD3 are at a logic "0" value. The input of "1-0-0" to decision circuit causes circuit 20 to generate an "increment" output, which is subsequently applied as an input to selector 22. Selector 22, in response, advances the current clock phase by the amount $\Delta\phi$, and transmits a clock signal with this new phase back to latches 18 and circuit 20. FIG. 4(b) illustrates the result of this positive phase adjustment on the incoming data stream, where the inputs to circuit 20 will be "0-1-1" for the associated clock cycle. As seen by reference to FIGS. 4(c) and 4(d), two additional phase adjustment steps are needed to fully align the clock phase with the incoming data stream. Referring to FIG. 4(c) in particular, it is to be noted that two data bits were required to be sampled to generate the $+\Delta\phi$ phase change between FIGS. 4(c) and 4(d), since the first set of samples associated with FIG. 4(c) are all a logic "0" value (due to the presence of contiguous logic 0's in the data stream).

The following table summarizes the actions of decision circuit 20 in response to the sampled data inputs.

| Inputs | | | Output |
|---|---|---|---|
| RD1 | RD2 | RD3 | $\phi_i$ |
| 1 | 1 | 1 | hold |
| 0 | 0 | 0 | hold |
| 1 | 1 | 0 | decrement |
| 0 | 0 | 1 | decrement |
| 1 | 0 | 0 | increment |
| 0 | 1 | 1 | increment |

As discussed above, the size of the phase adjustment $\Delta\phi$ is a function of the number of taps, N, forming tapped delay line 14. In particular, as the number of taps increases, the size of the phase adjustment will decrease. By decreasing $\Delta\phi$, it is possible to provide a more accurate alignment of the clock phase to the data. However, this requires the use of a larger tapped delay line and may also result in requiring a longer period of time to complete the alignment process.

In an exemplary embodiment of the present invention, the required operations of phase decision circuit 20 may be performed by a programmable logic array (PLA). A PLA, as is well known in the art, is a series of logic gates which may be coupled together in any desired arrangement to perform a series of logical functions. There exist many alternative ways in which a PLA may be configured to perform the phase adjustment function of the present invention, any of which would be fairly routine to implement for one skilled in the art and thus will not be described in detail.

When utilizing a PLA to determine the requisite phase adjustments, it is possible to use the remaining PLA capacity to incorporate additional protection and functionality into the design. In particular, it may be desirable to provide some means of assuring that the PLA selects one and only one valid phase for the clock signal. Otherwise, the PLA would continue to remain in an illegal state. To guarantee that at least one phase is selected, the PLA may be receptive to an external "RESET" signal which functions to select a particular phase by default. This default selection may be either random or fixed, according to the particular programming of the PLA. The RESET input is generated by a clock monitor 24 which functions to observe the output clock from phase selector 22. As long as phase selector 22 is generating a valid clock signal, clock monitor 24 remains inactive. However, when the recovered clock input to monitor 24 is no longer representative of the valid clock (e.g., disappearance of signal), monitor 24 transmits a RESET signal to the PLA. In one embodiment, monitor 24 may be an analog (or digital) timer which is responsive to the clock signal and functions to generate an output after a predetermined time interval has passed without the reception of a valid clock.

If more than one clock phase has been selected (due to an illegal input, for example, "1-0-1"), the PLA may also contain logic to ignore all but one selected phase. For example, the PLA may utilize a set of rules which dictate that the earliest phase be selected. Other equally valid criteria (including a randomized selection) may also be used.

Another optional external control to the PLA is indicated as "FORCE" in FIG. 1. The FORCE input, as its name implies, causes the phase adjustment to ignore the RD1, RD2 and RD3 inputs and instead step through a series of externally applied phase adjustments. This feature may be useful for applications that require the "received" clock to be aligned with the transmitter clock when there is no data being transmitted. Another optional input, labeled "HOLD" in FIG. 1, also allows the PLA to ignore the sampled data inputs. In this case, the PLA will instruct phase selector 22 to maintain its current clock selection. The HOLD function may be used in applications where there are known interruptions in the data stream and any decision of the PLA based upon the data samples would be unreliable.

Figure 5:
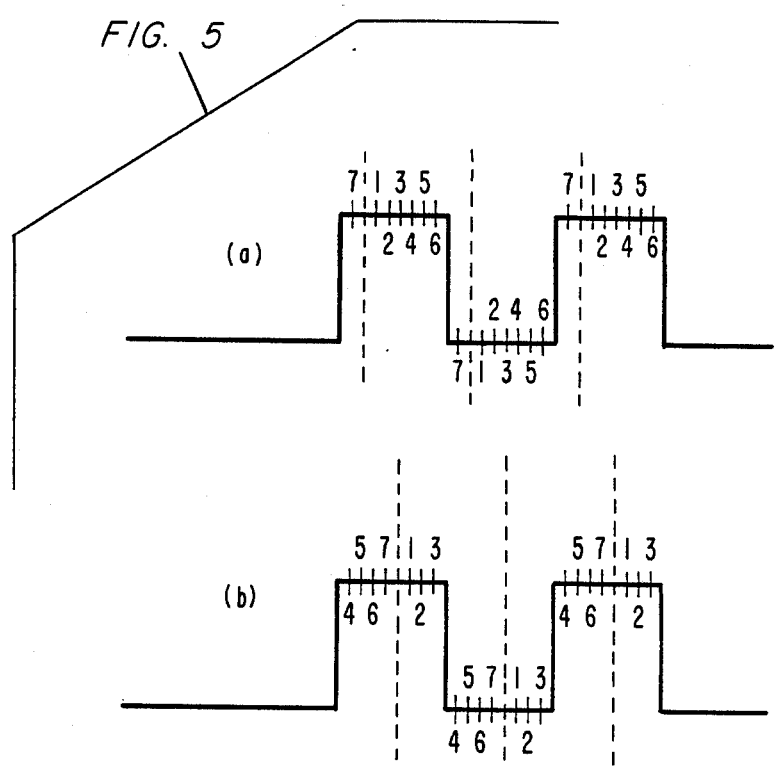
FIG. 5 illustrates, in the form of a set of timing diagrams, an incoming data stream which is sampled at a higher rate to accelerate the phase adjustment process.

Although the above description has concentrated on the utilization of three sampled data values, it is obvious that any number of sample values (greater than three) may also be used. By increasing the number of samples, additional information regarding the signal may be obtained. In particular, increasing the number of samples (to seven, for example) would aid locating the exact point of the data transition and thus decreasing the length of time needed to align the clock phase with the data. This can be explained by referring to FIG. 5, which illustrates two different situations using seven data samples. FIG. 5(a) represents the situation where the clock phase is nearly synchronous with the data, the transition in data value occurring between samples 6 and 7. Since the clock phase is nearly aligned with the data, only a few cycles through the PLA would be needed to perform this alignment, regardless of the phase adjustment interval $\Delta\phi$. In contrast, FIG. 5(b) illustrates a situation where the phase of the clock is further misaligned with the data, the transition occurring between samples 3 and 4. The information regarding the location of the transition (i.e., sample 3 being logic "0" and sample 4 being logic "1") can be used by the PLA to tell selector 22 to increment/decrement the phase by M phase adjustments, M being greater than one. For example, the PLA may tell selector 22 to increase the clock phase by three adjustment intervals. By performing this larger phase adjustment, the overall time taken to correctly align the clock with the data will decrease significantly. Obviously, the larger the number of samples, the easier it will be for the PLA to pinpoint the data transition.

It is to be noted that the data samples are not required to be uniformly spaced. For example, one embodiment of the present invention may utilize a series of five samples representing the 9, 19, 50, 80 and 85% intervals. Another embodiment may utilize a series of four samples (5, 10, 15, 20% intervals) before the midpoint (50%) and only two samples (75 and 90%) after the midpoint. This latter series of sample intervals may be especially important for situations where transmitting device-dependent noise characteristics (jitter, for example) are more likely to occur at the beginning of the data bit. Asymmetric sampling of the data in these situations will thus aid the phase decision circuit in establishing a valid clock phase.

Besides retiming the data and providing a recovered clock, other uses for these data samples exist. For example, the existence of pulse width distortion would become readily apparent by correlating the number of phase corrections associated with rising data transitions versus the phase corrections of falling edges. If the intervals associated with falling edges produce phase corrections of the opposite sign than intervals associated with rising edges, then pulse width distortion is most likely present. Additionally, the degree of jitter in the data stream may also be ascertained from the data samples.

Jitter, defined as the offset of data transition locations from their ideally clocked positions, may result in the input of erroneous data bit samples to the phase decision circuit. These samples may then cause the phase decision circuit to request an unnecessary change in the clock phase. Therefore, by monitoring the number of these requests which occur after clock alignment has been achieved, information regarding the presence of jitter may be acquired. Further, if more than three data bit samples are used, it is also possible to determine certain characteristics (Gaussian nature, for example) of the jitter.

Figure 6:
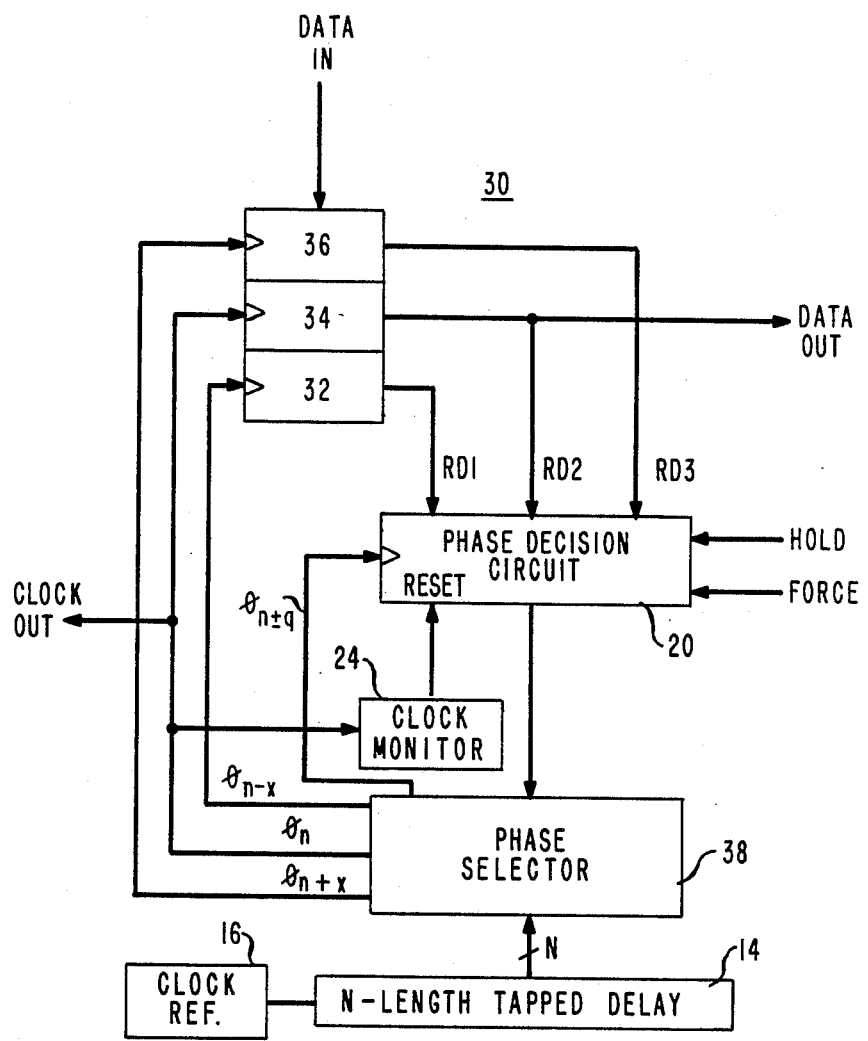
FIG. 6 illustrates, in block diagram form, an alternative arrangement for performing clock recovery which requires one less tapped delay line when compared with the arrangement illustrated in FIG. 1.

An alternative embodiment 30 of the clock recovery scheme of the present invention is illustrated in FIG. 6. This embodiment utilizes a different clocking arrangement which results in eliminating the tapped delay line utilized to generate the data samples. Referring to FIG. 6, retimed data samples RD1, RD2, and RD3 are formed by latches 32, 34 and 36, respectively, where each latch is responsive to a clock with a different phase. These phases, denoted $\phi_{n-y}$, $\phi_n$, and $\phi_{n+x}$ are generated by a phase selector 38. Similar to phase selector 22, phase selector 38 generates a clock signal with the current selected phase, $\phi_n$. Additionally, phase selector 38 generates a clock signal with a phase lagging the current phase by a predetermined amount, $\phi_{n-y}$, as well as a signal with a phase leading the current phase by this predetermined amount, $\phi_{n+x}$. Lagging clock signal $\phi_{n-y}$, as shown in FIG. 6, is applied as the clock input to latch 32, thus producing as an output retimed data sample RD1. Clock signal $\phi_n$ is applied as an input to latch 34 to produce retimed data sample RD2, where this data sample is used as the DATA OUT of recovery circuit 30. Lastly, leading clock signal $\phi_{n+x}$ is applied as the clock input to latch 36 to generate as the output retimed data sample RD3. Another clock signal, $\phi_{n+-q}$ is applied as the clock input to phase decision circuit 20, where clock signal $\phi_{n+-q}$ may be one of the three signals transmitted to latches 32, 34, 36, or, alternatively, another selected clock phase.

The sampled data values of RD1, RD2, and RD3 are applied as inputs to phase decision circuit 20, which functions in the manner described above to determine the current phase relationship between the incoming data stream and the locally generated clock. As discussed above, clock monitor 24 may be added to insure that phase decision circuit 20 always provides a valid clock signal. Additionally, decision circuit 20 may also take the form of a PLA in this embodiment, utilizing the same external inputs to the PLA, notably, RESET, HOLD and FORCE, to provide additional features to clock recovery arrangement 30. Obviously, the embodiment of FIG. 6 may be further modified to allow for a greater number of samples to be generated for each data bit. This would require an increase in the number of output lines from selector 38, and a comparable increase in the number of associated latches.

It is to be understood that various other arrangements may exist which are capable of performing the retiming and clock recovery functions of the present invention. In particular, the clock recovery scheme may be used with any coding scheme including, but not limited to, NRZ, Manchester, etc.

What is claimed is:

1. A clock recovery arrangement responsive to an incoming digital data stream for generating therefrom a retimed data output signal and a recovered clock output signal, said arrangement comprising a data input line for reception of the incoming data stream;

data sampling means coupled to the data input line and responsive to the recovered clock output signal for producing as an output a plurality of M clocked samples (RD1, RD2, . . ., RDM) of each data bit from said incoming data stream, M being at least equal to three, one clocked sample located at the approximate midpoint of the data bit and defined as the retimed data output of said clock recovery arrangement, at least one clocked sample located before the midpoint, and at least one other clocked sample located after the midpoint;

reference clock means for generating a clock output signal at a predetermined frequency;

clock phase generating means responsive to said reference clock output signal for generating a plurality of N clock signals at said predetermined frequency, adjacent clock signals being separated in phase by the amount 360°/N, denoted as phase interval $\Delta\phi$; and clock phase determination and selection means responsive to both the plurality of M clocked data bit samples from the data sampling means and the plurality of N clock signals from the clock phase generating means for generating as an output the recovered clock signal, said clock phase determination and selection means capable of comparing the logic values of said plurality of M clocked data bit samples and adjusting the phase of the current recovered clock output signal if all do not agree in value, the adjustment being to decrement the phase if the at least one clocked sample after the midpoint is different in value from the others and alternatively to increment the phase if the at least one clocked sample before the midpoint is different in value from the others.

2. A clock recovery arrangement as defined in claim 1 where M=3.

3. A clock recovery arrangement as defined in claim 1 wherein the arrangement further comprises clock monitoring means responsive to the recovered clock output signal for generating as an output a reset signal when said recovered clock signal is not present, said reset signal being applied as an input to the clock phase determination and selection means so as to cause said clock phase determination and selection means to choose a predetermined phase of clock signal, regardless of the values of the at least three clocked data bit samples.

4. A clock recovery arrangement as defined in claim 3 wherein the clock monitoring means comprises an analog timing circuit.

5. A clock recovery arrangement as defined in claim 3 wherein the clock monitoring means comprises a digital timing circuit.

6. A clock recovery arrangement as defined in claim 1 wherein the clock phase determination and selection means comprises programmable logic array means responsive to the plurality of M clocked data bit samples and the recovered clock signal for generating as an output a phase decision signal; and selection means responsive to both the plurality of N clock signals generated by the clock phase generating means and the phase decision signal generated by the programmable logic array means, said selection means generating as an output the selected one of N clock signals as determined by the clock phase decision signal.

7. A clock recovery arrangement as defined in claim 6 wherein the programmable logic array means is responsive to an external hold control signal to maintain the output of the selection means at a predetermined clock phase regardless of the values of the plurality of M clocked data bit samples.

8. A clock recovery arrangement as defined in claim 6 wherein the programmable logic array means is responsive to an external force control signal to sequentially modify the output of the selection means through a predetermined series of clock phases regardless of the values of the plurality of N clocked data bit samples.

9. A clock recovery arrangement as defined in claim 1 wherein the data sampling means comprises
an M-length tapped delay line responsive to the incoming digital data stream for producing as parallel outputs the plurality of M sampled data bits; and
a plurality of M latches, each latch responsive to a separate one of the plurality of M sampled data bits and the recovered clock signal for producing as an output the plurality of M clocked data bit samples.

10. A clock recovery arrangement as defined in claim 9 where $M=3$.

11. A clock recovery arrangement as defined in claim 9 where $M>3$ and the clock phase determination and selection means is capable of incrementing or decrementing the clock phase adjustment using more than one clock phase interval, as a function of the location of the change in logic value between adjacent data bit samples.

12. A clock recovery arrangement as defined in claim 1 wherein the data sampling means comprises
means for generating a plurality of M clock signals, one clock signal comprising the phase of the recovered clock signal, X clock signals comprising clock phases lagging the recovered clock phase ($X<M$), and $M-1-X$ clock signals comprising clock phases leading the recovered clock phase; and
a plurality of M clocked latches responsive to the incoming digital data stream, each latch responsive to a separate one of the plurality of M clock signals, said plurality of M latches producing as an output the plurality of M clocked data bit samples.

13. A clock recovery arrangement as defined in claim 12 where $M=3$.

14. A clock recovery arrangement as defined in claim 12 where $M>3$ and the clock phase determination and selection means is capable of incrementing or decrementing the clock phase adjustment using more than one clock phase interval, as a function of the location of the change in logic value between adjacent data bit samples.

15. A clock recovery arrangement as defined in claim 12 wherein the means for generating the plurality of M clock signals is the clock phase determination and selection means.

16. A method of providing a retimed data signal and a recovered clock signal from an incoming digital data signal, the method comprising the steps of:
a. providing a reference clock signal at a predetermined frequency;
b. sampling the reference clock signal to produce a plurality of N reference clock signals, adjacent clock signals being separated in phase by the amount $360°/N$, denoted as a clock phase interval $\Delta\phi$;
c. sampling each bit of the incoming digital data signal to produce a plurality of M data bit samples, one sample being located at the approximate midpoint of the data bit;
d. latching the plurality of M data bit samples with the recovered clock signal to produce a plurality of M clocked data bit samples;
e. defining the clocked midpoint sample as the retimed data signal;
f. comparing the logic values of the plurality of M clocked data bit samples;
g. incrementing the phase of the recovered clock signal if clocked data bit samples before the midpoint sample disagree in logic value with the midpoint sample and samples after the midpoint sample;
h. decrementing the phase of the recovered clock signal if the clocked data bit samples after the midpoint sample disagree in logic value with the midpoint sample and samples before the midpoint sample;
i. repeating steps g. and h. until all data bit samples agree in value.

17. The method according to claim 16 wherein in performing step (c), three sample bits are produced.

18. The method according to claim 16 wherein in performing step (c), more than three sample bits are produced.

* * * * *